United States Patent
Wang et al.

(10) Patent No.: US 9,543,462 B2
(45) Date of Patent: Jan. 10, 2017

(54) INSULATED-GATE PHOTOCONDUCTIVE SEMICONDUCTOR SWITCH

(71) Applicants: Xi'an University of Technology, Xi'an, Shaanxi (CN); THE BOARD OF TRUSTEES OF THE UNIVERSITY OF ILLINOIS, Urbana, IL (US)

(72) Inventors: Xinmei Wang, Shaanxi (CN); Sudip K. Mazumder, Chicago, IL (US); Wei Shi, Shaanxi (CN)

(73) Assignees: XI'AN UNIVERSITY OF TECHNOLOGY, Xi'An, Shaanxi (CN); THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 0 days.

(21) Appl. No.: 15/074,512

(22) Filed: Mar. 18, 2016

(65) Prior Publication Data

US 2016/0276518 A1    Sep. 22, 2016

Related U.S. Application Data

(60) Provisional application No. 62/135,920, filed on Mar. 20, 2015.

(51) Int. Cl.
*H01L 31/0352* (2006.01)
*H01L 31/119* (2006.01)
(Continued)

(52) U.S. Cl.
CPC .......... *H01L 31/119* (2013.01); *H01L 23/4825* (2013.01); *H01L 27/1443* (2013.01); *H01L 31/035281* (2013.01)

(58) Field of Classification Search
CPC ............. H01L 27/1443; H01L 23/4825; H01L 31/035281
(Continued)

(56) References Cited

U.S. PATENT DOCUMENTS

| 6,252,221 B1* | 6/2001 | Kaneko | .................. B82Y 20/00 250/214 LA |
| 2010/0052083 A1* | 3/2010 | Kasai | .................. H01L 31/0352 257/431 |

(Continued)

OTHER PUBLICATIONS

J.H. Leach, et al., "High voltage, bulk GaN-based photoconductive switches for pulsed power applications," Proc. of SPIE, vol. 8625, 86251Z-1), 2013, 7 pages.
(Continued)

*Primary Examiner* — George Fourson, III
(74) *Attorney, Agent, or Firm* — Birch, Stewart, Kolasch & Birch, LLP

(57) ABSTRACT

This present invention provides a novel photoconductive semiconductor switch (PCSS) comprising: a semi-insulating substrate, an anode formed on the upper surface of said semi-insulating substrate, a first n-type doped layer formed on the lower surface of said semi-insulating substrate, a p-type doped layer formed on said first n-type doped layer, a second n-type doped layer formed on said p-type doped layer, a cathode formed on said second n-type doped layer, several recesses facing towards said first n-type doped layer and vertically extending into a part of said first n-type doped layer, an insulating layer formed on said second n-type doped layer and on the walls and the bottoms of said recesses, a gate electrode consisting of two parts, one part of the which formed on said insulating layer on the walls and the bottoms of recesses, and the other part of the which formed on a part of the insulating layer on the second n-type doped layer for electrically connecting the part of the gate
(Continued)

electrode on the recesses, wherein the cathode and the gate electrode are electrically isolated.

6 Claims, 3 Drawing Sheets

(51) Int. Cl.
   *H01L 27/144* (2006.01)
   *H01L 23/482* (2006.01)
(58) Field of Classification Search
   USPC .......................................................... 257/459
   See application file for complete search history.

(56) References Cited

U.S. PATENT DOCUMENTS

2013/0029453 A1* 1/2013 Graham ............ H01L 31/03046
                                                        438/93
2015/0277208 A1* 10/2015 Park .................. H01L 31/02161
                                                        257/80
2016/0170288 A1* 6/2016 Moon ..................... G02F 1/353
                                                        250/504 R

OTHER PUBLICATIONS

J.S. Sullivan, et al., "6H-SiC Photoconductive Switches Triggered at Below Bandgap Wavelengths," IEEE Transactions on Dielectrics and Electrical Insulation, vol. 14, No. 4, Aug. 2007, pp. 980-985.
Jong-Hyun Kim, et al., "High Voltage Marx Generator Implementation using IGBT Stacks," IEEE Transactions on Dielectrics and Electrical Insulation, vol. 14, No. 4, Aug. 2007, pp. 931-936.
Robert P. Vaudo, et al., "Characteristics of semi-insulating, Fe—doped GaN substrates," Phys. Stat. Sol. (a) 200, No. 1, 2003, pp. 18-21.
S.F. Glover,et al., "Pulsed- and DC-Charged PCSS-Based Trigger Generators," IEEE Transactions on Plasma Science, vol. 38, No. 10, Oct. 2010, pp. 2701-2707.
Wei Shi, et al., "Lower Bound of Electrical Field for Maintaining a GaAs Photoconductive Semiconductor Switch in High-Gain Operating Mode," IEEE Transactions on Electron Devices, vol. 60, No. 4, Apr. 2013, pp. 1361-1364.

* cited by examiner

025# INSULATED-GATE PHOTOCONDUCTIVE SEMICONDUCTOR SWITCH

CROSS-REFERENCE TO RELATED APPLICATIONS

This application claims the benefit of U.S. Provisional Application 62/135,920 filed on Mar. 20, 2015.

TECHNICAL FIELD

This present invention relates to the field of semiconductor technology, specifically a novel photoconductive semiconductor switch.

BACKGROUND ART

A photoconductive semiconductor switch (PCSS) triggered with an ultra-short pulsed laser is a type of low-jitter ultra-broadband high-power switch device without potential spurious triggering caused by electro-magnetic interference. There are two operating modes of PCSS which depends on whether there is avalanche multiplication of photon-generated carriers, namely, the linear operating mode and the high-gain operating mode (also called the nonlinear mode or the lock-on mode). A traditional PCSS is composed of an anode, a semi-insulating substrate and a cathode. The semi-insulating substrate is usually obtained by highly compensating a low-resistivity semiconductor crystal with deep-energy-level impurities or defects, such as iron-doped GaN (GaN:Fe) and vanadium-doped SiC (SiC:V). Taking GaN for example, the resistivity of GaN crystal can reach a high level only by doping deep-energy-level Fe impurity with a concentration of more than $10^{17}$ cm$^{-3}$. Thus, the GaN:Fe crystal can be used as the semi-insulating substrate of the traditional PCSS. However, the dark-state resistance of the traditional PCSS is remarkably nonlinear, which is mainly caused by the unavoidable high-concentration deep energy levels. Consequently, the dark-state leakage current of the traditional PCSS will significantly increase with the bias voltage increasing until the traditional PCSS is broken down. The leakage current of the PCSS biased with a dc voltage source restricts the dc withstand voltage capability. Furthermore, since the average drift velocity of the photon-generated carriers is usually proportional to the bias voltage, it also restricts the photocurrent peak of the PCSS In addition, GaAs PCSS and InP PCSS can operate with the high-gain mode at a high bias voltage. The remarkable advantages of the high-gain operating mode lie in the fact that it can be triggered by a weak laser and the rising edge of the photocurrent pulse is much faster than that of the triggering laser, due to the avalanche multiplication of the photon-generated carriers. Therefore, said PCSS can choose a low-cost portable laser diode as the light source, rather than an expensive heavy pulsed power laser. The disadvantage of said GaAs PCSS and InP PCSS lies in the fact that when the PCSS operates in the high-gain mode, the PCSS is unable to turn off by itself in nanoseconds or even microseconds because the current is "locked on", unless the bias electric field across said semi-insulating substrate can quickly reduce to the level below the threshold electric field for maintaining the high-gain mode. The existing solution to the above-mentioned problems is to use a low-duty-ratio high-voltage pulse source as the bias voltage source of PCSS, such as Marx circuit, which can inhibit the dark-state leakage current of PCSS and force the GaAs PCSS and InP PCSS to quit from the high-gain operating mode. However, since a high-voltage pulse source usually comprises several high-power devices and the impedance matching of the transmission lines between these devices is difficult, this kind of PCSS system is high in cost and poor in portability, especially when a high repetition rate is required.

SUMMARY OF THE INVENTION

The purpose of the present invention is to design a novel PCSS in order to improve the above-mentioned problems.

The present invention provides a PCSS device comprising: a semi-insulating substrate, an anode formed on the upper surface of said semi-insulating substrate, a first n-type doped layer formed on the lower surface of said semi-insulating substrate, a p-type doped layer formed on said first n-type doped layer, a second n-type doped layer formed on said p-type doped layer, a cathode formed on said second n-type doped layer, several recesses extending from the surface of said second n-type doped layer and vertically extending into a part of said first n-type doped layer, an insulating layer formed on said second n-type doped layer and on the walls and the bottoms of said recesses, a gate electrode consisting of two parts, one part of which formed on said insulating layer on the walls and the bottoms of recesses, and the other part of which formed on a part of the insulating layer on the second n-type doped layer for electrically connecting the part of the gate electrode on the recesses, wherein the cathode and the gate electrode are electrically isolated, wherein the concentration and the thickness parameters of said first n-type doped layer, said p-type doped layer and said second n-type doped layer are designed to ensure that the space-charge region of the reverse-biased p-n junction between said first n-type doped layer and said p-type doped layer will first expand to said semi-insulating substrate rather than to said second n-type doped layer, with the dc bias voltage increasing.

Preferred, the cathode, the insulating layer and the gate electrode on said second n-type doped layer are positioned in such a manner that the cathode is on the surface of said second n-type doped layer, the insulating layer is on the surface of the cathode, and the gate electrode is on the surface of the insulating layer, wherein the recesses extend through the cathode, the second n-type doped layer and the p-type doped layer into a part of said first n-type doped layer.

Preferred, the cathode, the insulating layer and the gate electrode on said second n-type doped layer are positioned in such a manner that the cathode is on a part of the surface of said second n-type doped layer, the insulating layer is on another part of the surface of said second n-type doped layer which is not covered by the cathode, the gate electrode is on the surface of said insulating layer and separated from the cathode to keep electrical isolation each other, and said recesses extend through said second n-type doped layer and said p-type doped layer into a part of said first n-type doped layer.

Preferred, said first n-type doped layer, said p-type doped layer, said second n-type doped layer, said insulating layer and said gate electrode form a metal-insulator-semiconductor field effect transistor (MISFET) structure, wherein the gate electrode of each MISFET cell is said gate electrode located on the bottom of each said recess, and all of the MISFET cells are parallel-connected.

Preferred, the amount, shape, and arrangement of said MISFET cells are chosen based on such a principle that it would: 1) decrease the current density of said photoconductive semiconductor switch; 2) make the total leakage current of the channels of said MISFET cells small; and 3) be suitable for the subsequent packing technology.

Preferred, the breakdown voltage threshold of the reverse-biased p-n junction between said first n-type doped layer and said p-type doped layer is between 0.1 and 0.9 times of the rated dc-bias voltage of said photoconductive semiconductor switch.

The beneficial effects: the novel PCSS of the present invention improves the leakage-current problem of the traditional PCSS in dark state biased at a dc voltage. Therefore, the novel PCSS has a higher dc withstand voltage and photocurrent pulse peak than those of a traditional vertical PCSS with the same substrate. Moreover, the novel PCSS improves the current lock-on problem of a traditional GaAs PCSS and InP PCSS biased with a dc voltage source. Because the novel PCSS does not require any high-voltage pulsed source, such as Marx circuit, the advantage of the PCSS lies in its low system cost, easy portability and high repetition rate.

Wherein, 1 refers to the anode, 2 refers to the cathode, 3 refers to the gate electrode, 4 refers to the insulating layer, 6 refers to the semi-insulating substrate (i.e., the laser-triggered area), 7 refers to the gate-triggered area, 9 refers to the pulsed laser, 12 refers to the first n-type doped layer, 13 refers to the p-type doped layer, and 14 refers to the second n-type doped layer.

DETAILED DESCRIPTION OF THE EMBODIMENTS

The technology solution of the present invention can be fully understood from the following detailed description of specific embodiments in conjunction with the following drawings.

Figure 1:
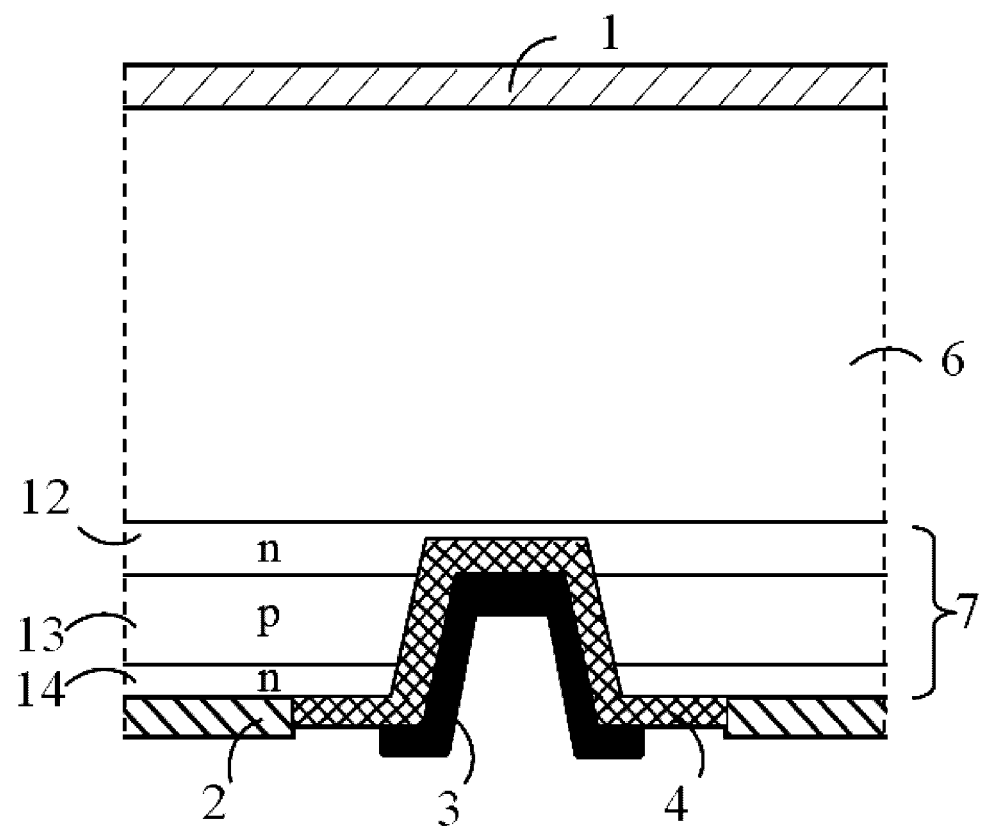
FIG. 1 is an exemplary part sectioned view of the novel PCSS device of the present invention.

FIG. 1 is a cross-sectional view of the PCSS device of the present invention. As shown in FIG. 1, the PCSS device of the present invention comprises: a semi-insulating substrate 6, an anode 1 formed on the upper surface of the semi-insulating substrate 6, a first n-type doped layer 12 formed on the lower surface of the semi-insulating substrate 6, a p-type doped layer 13 formed on the first n-type doped layer 12, a second n-type doped layer 14 formed on the p-type doped layer 13, a cathode 2 formed on the second n-type doped layer 14, several recesses facing towards the first n-type doped layer 12 and vertically extending into a part of the first n-type doped layer 12, an insulating layer 4 formed on the second n-type doped layer 14 and on the walls and the bottoms of said recesses, a gate electrode 3 consisting of two parts, one part of the which is formed on said insulating layer 4 on the walls and the bottoms of recesses, and the other part of the which is formed on a part of the insulating layer 4 on the second n-type doped layer for electrically connecting the part of the gate electrode on the recesses, wherein the cathode 2 and the gate electrode 3 are electrically isolated.

Moreover, the concentration and the thickness parameters of said first n-type doped layer, said p-type doped layer and said second n-type doped layer are designed to ensure that the space-charge region of the reverse-biased p-n junction between said first n-type doped layer and said p-type doped layer will first expand to said semi-insulating substrate rather than to said second n-type doped layer, with the dc bias voltage increasing.

In one embodiment, it is the positional relation among the cathode 2, the insulating layer 4 and the gate electrode 3 on the second n-type doped layer 14 that the cathode 2 is on the surface of the second n-type doped layer 14, the insulating layer 4 is on the surface of the cathode 2, and the gate electrode 3 is on the surface of the insulating layer 4. In this case, the recesses extend through the cathode 2, the second n-type doped layer 14 and the p-type doped layer 13 into a part of the first n-type doped layer 12; and the cathode 2 and the gate electrode 3 are electrically isolated since there is the insulating layer 4 covering on the walls and the bottoms of the recesses.

In another embodiment, it is the positional relation among the cathode 2, the insulating layer 4 and the gate electrode 3 on the second n-type doped layer 14 that the cathode 2 is on a part of the surface of the second n-type doped layer 14, the insulating layer 4 is on another part of the surface of the second n-type doped layer 14 which is not covered by the cathode 2, the gate electrode 3 is on the surface of the insulating layer 4 and separated from the cathode 2 to keep electrical isolation each other, and the recesses extend through the second n-type doped layer 14 and the p-type doped layer 13 into a part of the first n-type doped layer 12.

Figure 6:
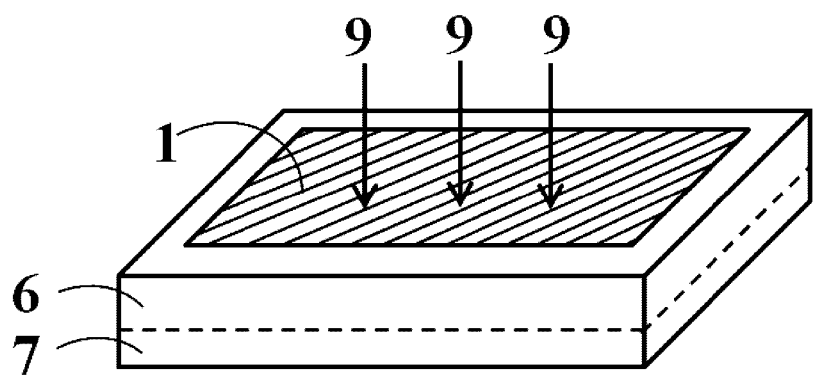
FIG. 6 depicts the pulsed laser entering the semi-insulating substrate through the anode of the switch of the present invention.
Figure 7:
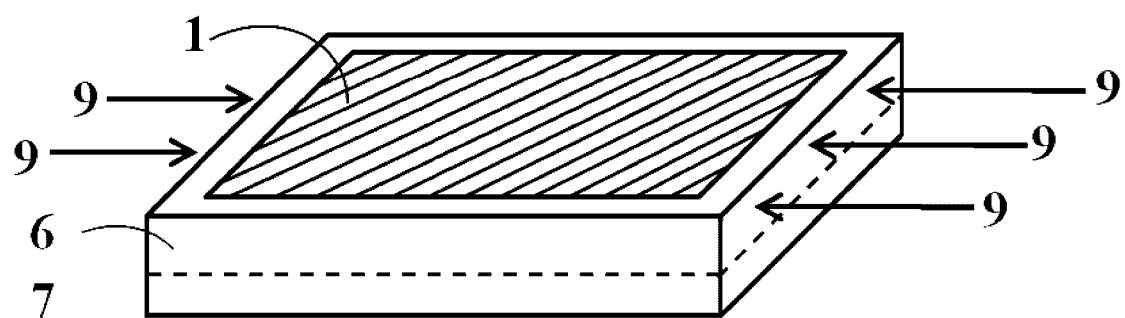
FIG. 7 depicts the pulsed laser entering the semi-insulating substrate through the sides of the semi-insulating substrate of the switch of the present invention.

Generally, the laser beams enter the laser-triggered area through the anode or the sides of the semi-insulating substrate, as shown in FIGS. 6 and 7, leading to photon-generated electron-hole pairs inside the semi-insulating substrate. Therefore, the semi-insulating substrate 6 can be called a laser-triggered area 6. The PCSS working, the applied gate voltage will trigger the movements of the electrons or the holes in the first n-type doped layer 12, the p-type doped layer 13, and the second n-type doped layer 14, and thus the first n-type doped layer 12, the p-type doped layer 13, and the second n-type doped layer 14 can be collectively called a gate-triggered area 7.

Figure 2:
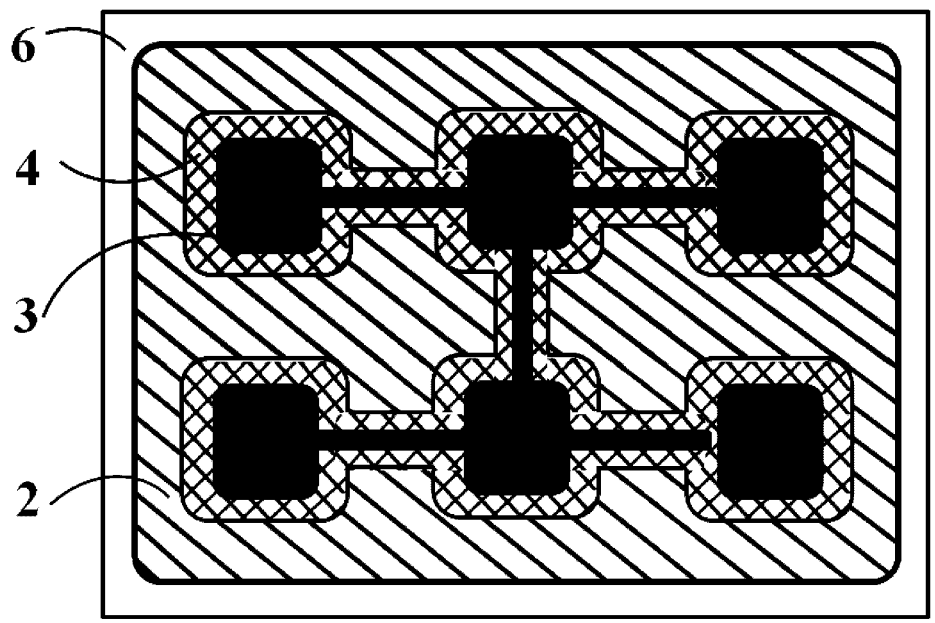
FIG. 2 is the schematic diagram of the layout of recesses and its electric connection of one embodiment.
Figure 3:
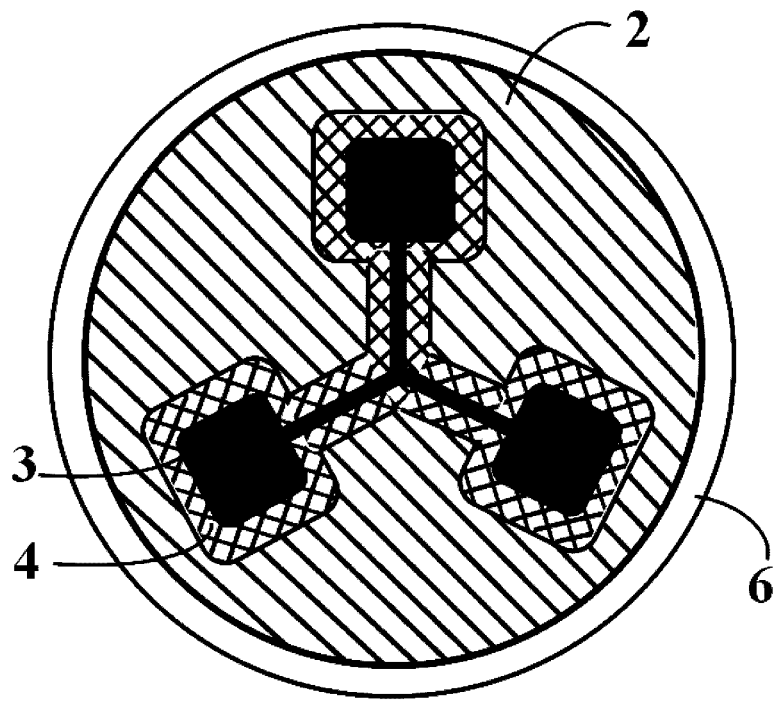
FIG. 3 is the schematic diagram of the layout of recesses and its electric connection of another embodiment.

The foresaid several recesses are etched vertically along the second n-type doped layer 14 to the first n-type doped layer 12. The vertical section of each of the recesses is in the shape of "V" or "U", i.e. V-shaped or U-shaped recesses. The part of the gate electrode 3 on the recesses should be electrically connected with each other by any well-known method in this art, through the other part of gate electrode 3 (on the insulating layer 4 covering on the second n-type doped layer 14), wherein one embodiment is shown in FIGS. 2 and 3 to exhibit the layout of recesses and the relevant electric connection.

An n-channel metal-insulator-semiconductor field effect transistor (MISFET) structure is made up of the first n-type doped layer 12, the p-type doped layer 13, the second n-type doped layer 14, insulating layer 4, and gate electrode 3. The MISFET structure which includes the gate electrode 3 located inside one recess is regarded as a MISFET cell. It can be known from the naming rule of the source electrode and drain electrode of a normal MISFET device that the doped layer 12 connected to the high potential end of n-channel can be regarded as the drain electrode of the MISFET structure. The each drain electrodes of MISFET cells are electrically connected with each other. The doped layer 14 connected to the low potential end of n-channel can be seen as the source electrode of the MISFET structure. The electrode 3 can be regarded as the gate electrode of the MISFET structure. In short, the source electrodes, the drain electrodes, and the gate electrodes of the MISFET cells are connected respectively, and thus the all MISFET cells are parallel-connected. It is an advantage that the on-state voltage drop of the MISFET cells can be ignored since the on-state resistance of the MISFET cells in parallel connection is quite small. The equivalent circuit model of the integral structure of the MISFET cells is an ideal n-channel MISFET element. The preferred design requirements on the amount, shape, and arrangement of the MISFET cells (namely the amount, shape, and arrangement of the recesses) meet conducive to: 1) decrease the current density of the PCSS; 2) make the total leakage current of the channels of said MISFET cells small; 3) be suitable for the subsequent packing technology.

The anode 1 can be made from well-known materials. The wavelength of the triggering laser being less than the intrinsic absorption edge of the semi-insulating substrate material, the laser beams enter the semi-insulating substrate preferably from the anode considering that its light absorption depth is small. Hence, the anode is better to be made of transparent conductive materials such as well-known indium-tin oxid. When the laser wavelength is longer than the intrinsic absorption edge, the laser beams enter the semi-insulating substrate preferably from the sides of the semi-insulating substrate due to its great light absorption depth. In this case, the anode can be made of common metals using the well-known sputtering method and chemical vapor deposition (CVD) method, but not limited to transparent conductive materials.

The n-type doped layer 12, p-type doped layer 13, and n-type doped layer 14 can be made using either the epitaxial growth technique or other techniques.

The insulating layer 4 can be made through the well-known deposition method or coating method and from the well-known materials, such as dense $SiO_2$ and $Si_3N_4$.

The gate electrode 3 can be made by the well-known sputtering method and CVD method and from well-known metal materials, such as Al, Ni, Au, and Cu.

The cathode 2 can be made by the well-known sputtering method and CVD method and from well-known metal materials, such as Al, Au, and Cu.

In practice, the concentration and thickness parameters of the doped layers (doped layers 12, 13 and 14) are designed to ensure that the space-charge region of the reverse-biased p-n junction between the doped layers 12 and 13 will first expand to the laser-triggered area 6 rather than the doped layer 14, with the dc bias voltage increasing. The reverse-biased p-n junction is equivalent to a voltage-stabilizing diode. The breakdown voltage threshold ($V_{th}$) of the reverse-biased p-n junction is between 0.1 and 0.9 times of the rated dc-bias voltage of the novel PCSS. There is a forward-biased p-n junction between the doped layers 13 and 14. However, the voltage drop across the forward p-n junction is negligible since it is very small. The resistances of the doped layers 13, 14, and 15 are so small that the voltage drops across them are negligible. Therefore, when the applied bias voltage of the PCSS is higher than $V_{th}$, the voltage across the gate-triggered area 7 is a constant, $V_{th}$.

The steps of the working process of the novel PCSS in the present invention are as follows:

1) In static state (before the laser reaches the PCSS), laser-triggered area 6 and gate-triggered area 7 share the applied dc-bias voltage ($U_s$). The voltage across the gate electrode-triggered 7 is $V_{th}$ and the voltage across the laser-triggered area 6 is ($U_s-V_{th}$) which may be slightly less than the maximum dc withstand voltage of the semi-insulating substrate. As mentioned above, the resistivity of the semi-insulating substrate is nonlinear. The higher the voltage, the smaller the resistivity. Therefore, the resistance of the laser-triggered area 6 is a function of its voltage which is written as R(u). Then the leakage current of the novel PCSS in static state is $$\frac{U_s-V_{th}}{R\mid_{(U_s-V_{th})}},$$

which is less than the dark-state leakage current $$\frac{U_s}{R\mid_{U_s}}$$

of a traditional vertical PCSS with the same substrate under the same dc-bias voltage.

2) After the applied positive voltage signal reaches the gate electrode 3, the n-channel of MISFET cells will be opened in nanoseconds. Thus, electrons are able to flow from the n-doped layer 14 to the doped layer 12 through the channel which means that the p-n junction between the doped layers 12 and 13 is not reverse-biased and the gate-triggered area 7 is opened. Hence the voltage across the gate electrode-triggered 7 transfers to the laser-triggered area 6, in which case the laser-triggered area 6 withstands a high voltage of $U_s$ which may be higher than the maximum dc withstand voltage of the laser-triggered area 6. It is known to those skilled in the art that semiconductors can withstand a transient high voltage which is several times of the maximum dc withstand voltage. Then jumping to the third step is as follows before a high-voltage breakdown occurs in the laser-triggered area 6.

3) Photoelectron-hole pairs appear when the laser 9 illuminating the laser-triggered area. The electron-hole pairs are separated under the electric field across the laser-triggered area 6 and move towards the anode and the cathode respectively, which opens the laser-triggered area 6. Therefore, the PCSS device is open and starts to output photocurrent.

4) When the applied triggering signals (i.e., the pulsed laser and the gate voltage) cease, the nonequilibrium carriers inside the laser-triggered area 6 will disappear for having been recombined and absorbed by electrode and then the substrate returns to the high resistance state; a no-voltage signal or negative voltage signal applied to the gate electrode 3 closes the conducting channel of MISFET cells in nanoseconds, and then the p-n junction between the doped layers 12 and 13 returns to the reverse breakdown state. Thus, the PCSS returns to the static state since the laser-triggered area 6 and the gate-triggered area 7 are both closed.

Regarding the triggering-signal time sequence of the novel PCSS in the present invention, there is only one requirement that the gate-triggered area 7 should be opened earlier than the laser-triggered area 6. Thus, there are two possible signal time sequences in the turn-off process of the novel PCSS, as illustrated in FIGS. 4 and 5 respectively.

Figure 4:
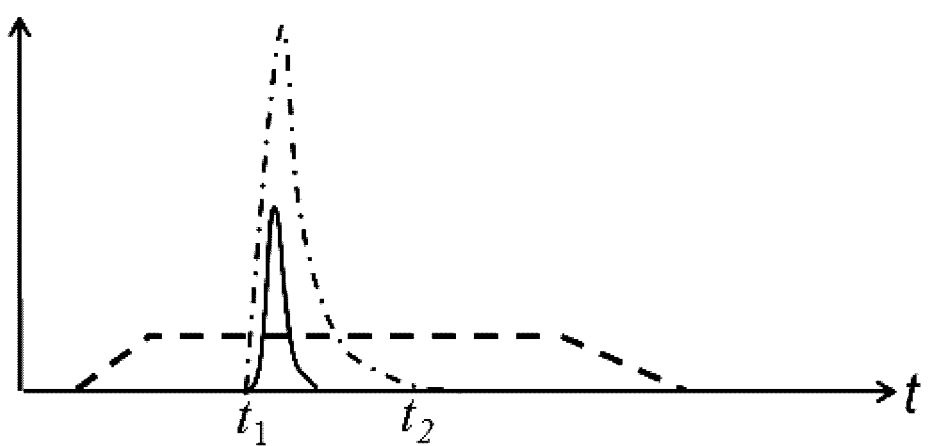
FIG. 4 is one rational time sequence of the triggering signals.

FIG. 4 shows a time sequence of the triggering signals, wherein the dashed line refers to the gate voltage, the solid line refers to the laser pulse waveform, the dotted line refers to the amount of the nonequilibrium carriers inside the laser-triggered area 6, $t_1$ refers to the starting time when the PCSS outputs a current pulse, and $t_2$ refers to the end time of the PCSS current pulse. The time sequence is applicable to the linear operating mode of the PCSS. When the applied triggering laser ceases, the photon-generated carriers will disappear quickly due to the recombination and the absorption, the substrate recovers the high resistance state, and then the output current of the PCSS tends to zero. Next, a no-voltage signal or negative voltage signal is applied to the gate electrode 3 and then closes the conducting channels of MISFET cells in nanoseconds, which leads to the p-n junction between doped layers 12 and 13 returns to the initial reverse-breakdown state and hence the gate-triggered area 7 is closed.

Figure 5:
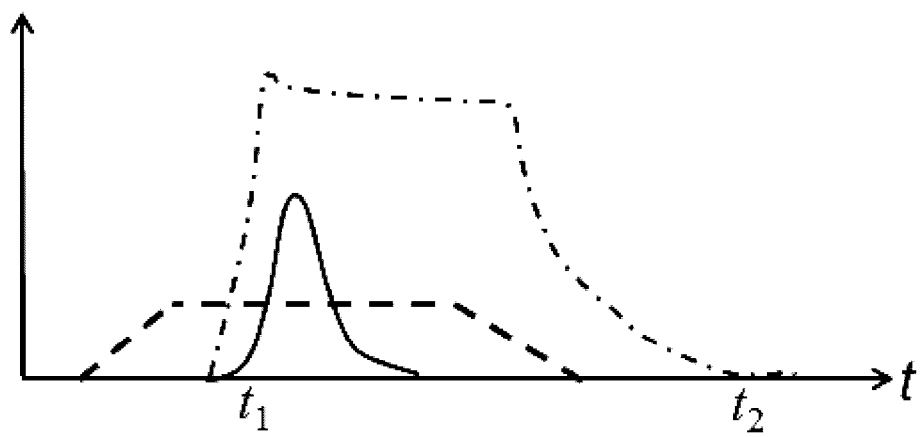
FIG. 5 is another rational time sequence of the triggering signals.

FIG. 5 is another time sequence of the triggering signals, wherein the dashed line refers to the gate voltage, the solid line refers to the laser pulse waveform, the dotted line refers to the amount of the nonequilibrium carriers inside the laser-triggered area 6, $t_1$ refers to the starting time when the PCSS outputs a current pulse, and $t_2$ refers to the end time of the PCSS current pulse. The time sequence is applicable to the nonlinear operating mode of the PCSS. After the laser ceases, the laser-triggered area 6 is unable to close automatically by itself, because the carrier avalanche multiplication proceeds in the semi-insulating substrate. Next, a no-voltage signal or negative voltage signal is applied to the gate electrode 3 so as to close the conducting channels of the MISFET cells in nanoseconds, during which the voltage across the laser-triggered area 6 is transferred to the gate-triggered area 7 rapidly. Once the electric field across laser-triggered area 6 falls below the threshold voltage for maintaining the high-gain operating mode, the laser-triggered area 6 will quit from the high-gain mode and gradually recover the initial high resistance state.

The beneficial effects of the novel PCSS of the present invention are: the novel PCSS of the present invention alleviates the leakage-current problem of the traditional PCSS in dark state biased at a dc voltage. Therefore, the novel PCSS is higher in the dc withstand voltage and the photocurrent pulse peak than a traditional vertical PCSS with the same substrate. Moreover, the novel PCSS improves the current lock-on problem of a traditional GaAs PCSS and InP PCSS biased with a dc voltage source. Because the novel PCSS does not need any high-voltage pulsed source, such as Marx circuit, the PCSS is of low system cost, portability and high repetition rate.

The novel PCSS device can be made through the well-known semiconductor technology. Those skilled in the art are able to make the PCSS device through the well-known semiconductor technology after reading the description of the present invention and clearly understanding the PCSS structure. Hence, the manufacture steps are not mentioned herein.

A further description of the present invention is set forth through an embodiment below.

Through the hydride vapor phase epitaxy based on a sapphire wafer, a 2-inch-diameter semi-insulating GaN:Fe substrate is obtained with the thickness (D) of 600-4000 μm and the dark-state resistivity of more than $1\times10^8 \Omega \cdot cm$. To avoid the current crowding, the n-type doped layer 12 is composed of a heavily doped n-type epitaxial layer with the thickness of 1.5-3 μm and the concentration of $1\times10^{15}$-$1\times10^{18}$ $cm^{-3}$, and a lightly doped n-type epitaxial layer with the thickness of 0.5-15 μm and the concentration of $1\times10^{13}$-$1\times10^{16}$ $cm^{-3}$ grows on the former. The p-type doped layer 13 is 10-200 μm in thickness and $1\times10^{14}$-$1\times10^{17}$ $cm^{-3}$ in concentration. The n-type doped layer 14 is 0.1-3 μm in thickness and $1\times10^{15}$-$1\times10^{21}$ $cm^{-3}$ in concentration. The breakdown voltage threshold ($V_{th}$) of the reverse-biased p-n junction is between 20 and $2\times10^4$ V. There are $1$-$10^4$ U-shaped n-channel MISFET cells as shown in FIG. 2 by using the conventional vertical MISFET technology, wherein the recess etching depth is 1-15 μm reaching into the n-type doped layer 12 and the insulating layer 4 is made of dense $Si_3N_4$ with the deposition thickness of 1-15 μm.

The laser beams for test are emitted by a Q-switched YAG laser with the pulse width of 1 ns and the wavelength of 532 nm. The 0.5-mm-diameter optical fibers are grouped into 11 bands and placed at both sides of the PCSS, as shown in FIG. 7. The fiber bands are interdigitaged in opposite direction so as to distribute the photocurrent evenly for improving the through-current capacity of the PCSS.

The applied dc-bias voltage (Us) is two times $V_{th}$, which means the dc-bias voltage across the semi-insulating substrate is also $V_{th}$. The time sequence of the triggering signals is shown in FIG. 4. Through a conventional driving circuit of MISFET power devices, a 10 V gate voltage pulse is obtained with the rising edge of 20 ns, the falling edge of 30 ns, and the pulse bandwidth of 80 ns. The laser device generates a 5 mJ laser pulse after the gate-triggered area 7 is opened. Since the pulse width of the laser is only 1 ns and the carrier lifetime of the GaN:Fe is in the level of subnanosecond, the output electric pulse waveform of the novel PCSS in the present invention is similar to the laser waveform, but the former pulse width is slightly broader. Based on the well-known GaN velocity-field characteristic curves, the average drift velocity of the photon-generated carriers is nearly proportional to the bias electric field of the semi-insulating substrate when the electric field is less than 150 kV/cm. In other words, when (Us/D)<150 kV/cm, the higher the Us, the larger the photocurrent pulse peak of the embodiment.

A comparison test is carried out between the above novel PCSS and a traditional vertical PCSS made of the same semi-insulating GaN:Fe wafer. The dark-state leakage current of the traditional PCSS is twice that of the novel PCSS in static state under the same dc-bias voltage. The photocurrent peak of the novel PCSS is about twice that of the traditional PCSS on condition that the dc-bias electric fields across the semi-insulating substrates are the same and less than 150 kV/cm.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. A photoconductive semiconductor switch comprising: a semi-insulating substrate, an anode formed on the upper surface of said semi-insulating substrate, a first n-type doped layer formed on the lower surface of said semi-insulating substrate, a p-type doped layer formed on said first n-type doped layer, a second n-type doped layer formed on said p-type doped layer, a cathode formed on said second n-type doped layer, several recesses extending from the surface of said second n-type doped layer towards said first n-type doped layer and vertically extending into a part of said first n-type doped layer, an insulating layer formed on said second n-type doped layer and on the walls and the bottoms of said recesses, a gate electrode consisting of two parts, one part of which formed on said insulating layer on the walls and the bottoms of recesses, and the other part of which formed on a part of the insulating layer on the second n-type doped layer for electrically connecting the part of the gate electrode on the recesses, wherein the cathode and the gate electrode are electrically isolated, wherein the concentration and the thickness parameters of said first n-type doped layer, said p-type doped layer and said second n-type doped layer are designed to ensure that the space-charge region of the reverse-biased p-n junction between said first n-type doped layer and said p-type doped layer will first expand to said semi-insulating substrate rather than to said second n-type doped layer, with the dc bias voltage increasing.

2. The photoconductive semiconductor switch of claim 1, wherein the cathode, the insulating layer and the gate electrode on said second n-type doped layer are positioned in such a manner that the cathode is on the surface of said second n-type doped layer, the insulating layer is on the surface of the cathode, and the gate electrode is on the surface of the insulating layer, wherein the recesses extend through the cathode, the second n-type doped layer and the p-type doped layer into a part of said first n-type doped layer.

3. The photoconductive semiconductor switch of claim 1, wherein the cathode, the insulating layer and the gate electrode on said second n-type doped layer are positioned in such a manner that the cathode is on a part of the surface of said second n-type doped layer, the insulating layer is on another part of the surface of said second n-type doped layer which is not covered by the cathode, the gate electrode is on the surface of said insulating layer and separated from the cathode to keep electrical isolation each other, and said recesses extend through said second n-type doped layer and said p-type doped layer into a part of said first n-type doped layer.

4. The photoconductive semiconductor switch of claim 1, wherein said first n-type doped layer, said p-type doped layer, said second n-type doped layer, said insulating layer and said gate electrode form a metal-insulator-semiconductor field effect transistor (MISFET) structure, wherein the gate electrode of each MISFET cell is said gate electrode located on the bottom of each said recess, and all of the MISFET cells are parallel-connected.

5. The photoconductive semiconductor switch of claim 4, wherein the amount, shape, and arrangement of said MISFET cells are chosen based on such a principle that it would: 1) decrease the current density of said photoconductive semiconductor switch; 2) make the total leakage current of the channels of said MISFET cells small; and 3) be suitable for the subsequent packing technology.

6. The photoconductive semiconductor switch of claim 1, wherein the breakdown voltage threshold of the reverse-biased p-n junction between said first n-type doped layer and said p-type doped layer is between 0.1 and 0.9 times of the rated dc-bias voltage of said photoconductive semiconductor switch.

\* \* \* \* \*